(12) United States Patent
Zou et al.

(10) Patent No.: US 6,716,661 B2
(45) Date of Patent: Apr. 6, 2004

(54) PROCESS TO FABRICATE AN INTEGRATED MICRO-FLUIDIC SYSTEM ON A SINGLE WAFER

(75) Inventors: Quanbo Zou, Singapore (SG); Yu Chen, Singapore (SG); Janak Singh, Singapore (SG); Tit Meng Lim, Singapore (SG); Tie Yan, Singapore (SG); Chew Kiat Heng, Singapore (SG)

(73) Assignees: Institute of Microelectronics, Singapore (SG); National University of Singapore, Singapore (SG)

( * ) Notice: Subject to any disclaimer, the term of this patent is extended or adjusted under 35 U.S.C. 154(b) by 12 days.

(21) Appl. No.: 10/147,006

(22) Filed: May 16, 2002

(65) Prior Publication Data

US 2003/0215972 A1 Nov. 20, 2003

(51) Int. Cl.[7] .............................................. H01L 21/00
(52) U.S. Cl. ............................ 438/49; 438/52; 438/53; 438/55; 438/456
(58) Field of Search ............................ 438/49–55, 456

(56) References Cited

U.S. PATENT DOCUMENTS

| | | | |
|---|---|---|---|
| 5,426,070 A | * 6/1995 | Shaw et al. ..................... 216/2 |
| 5,719,073 A | 2/1998 | Shaw et al. | |
| 6,075,269 A | 6/2000 | Terasawa et al. ............. 257/330 |
| 6,093,330 A | * 7/2000 | Chong et al. .................... 216/2 |
| 6,180,536 B1 | 1/2001 | Chong et al. | |
| 6,225,140 B1 | 5/2001 | Liu et al. ...................... 438/48 |
| 6,342,430 B1 | * 1/2002 | Adams et al. ............... 438/424 |
| 6,461,888 B1 | * 10/2002 | Sridhar et al. ................ 438/52 |
| 6,541,831 B2 | * 4/2003 | Lee et al. .................... 257/415 |
| 6,569,702 B2 | * 5/2003 | Cho et al. ..................... 438/50 |

OTHER PUBLICATIONS

Meint Boer et al., "Micromachining of buried micro channels in silicon", J. Microelectromech. Systems, vol. 9, No. 1., pp. 94–103, 2000.

Quanbo Zou et al., CoMSaT: "A novel single –chip fabrication technique for three–dimensional MEMs, Sensors and Actuators", A. 72, No. 2, pp. 115–124, 1999.

J. Chen et al., "A high–resolution silicon monolithic nozzle array for ink jet printing", The 8th Int'l Conf. on Solid–State Sensors and Actuators (Trans '95, and Eurosensors IX), Stockholm, Sweden, pp. 321–324, Jun. 1995.

Quanbo Zou et al., "Single –chip fabrication of integrated fluid system (IFS)", Pr c. llh IEEE MEMS98 Workshop, Heidelberg, (Germany), pp. 448–453, Jan. 1998.

* cited by examiner

*Primary Examiner*—Thanh Nguyen
(74) *Attorney, Agent, or Firm*—George O. Saile; Stephen B. Ackerman

(57) ABSTRACT

Formation of micro-fluidic systems is normally achieved using a multi-wafer fabrication procedure. The present invention teaches how a complete micro-fluidic system can be implemented on a single chip. The invention uses only dry etch processes to form micro-chambers. In particular, it makes use of deep reactive ion etching whereby multiple trenches of differing depths may be formed simultaneously. Buried micro-chambers are formed by isotropically increasing trench widths using an etchant that does not attack the mask so the trenches grow wider beneath the surface until they merge. Deposition of a dielectric layer over the trenches allows some trenches to be sealed and some to be left open. Micro-pumps are formed by including in the micro-chamber roof a layer that is used to change chamber volume either through electrostatically induced motion or through thermal mismatch as a result of its being heated.

31 Claims, 4 Drawing Sheets

PROCESS TO FABRICATE AN INTEGRATED MICRO-FLUIDIC SYSTEM ON A SINGLE WAFER

FIELD OF THE INVENTION

The invention relates to the general field of micro-fluidics with particular reference to system integration on a single chip.

BACKGROUND OF THE INVENTION

Integrated micro-fluidic systems have many promising applications in medical treatment, industrial process control, biomedical analysis, etc. MEMS (micro electro-mechanical systems) is one of the most promising ways to implement various kinds of such integrated systems, because of the mass production potential offered by silicon wafers. However, most of the integrated devices developed so far, including micro fluidic handling and detection mechanisms, have utilized a multiple-wafer process. This has increased the difficulty of electronic integration and the cost of fabrication, and has degraded performance due to large fluidic or thermal parasitics. There is therefore a need for a single silicon wafer process to solve these problems.

There are several disclosed ways of fabricating micro fluidic devices using single silicon wafers [see references 1–4 below]. However, these techniques have many difficulties in integration of the micro fluidic control, thermal reactors or sensing/detection mechanism on-chip, due to the non-compatible process problem. Normally, large chambers (cavities) have been formed by wet etching/undercutting which provides poor process control. Moreover, integration of the active components (e.g., detectors/sensors, reactors, etc.) has not been implemented for the same reasons. In summary, a process for integrated fluidic systems e.g., micro-total-analysis-system ($\mu$TAS) or lab-on-a-chip (LoC) using a single silicon wafer approach has thus far not been reported. The present invention seeks to disclose such a process.

REFERENCES

1. Meint Boer et al, 'Micromachining of buried micro channels in silicon', J. Microelectromech. Systems, Vol.9, No.1, pp.94–103, 2000.
2. Quanbo Zou et al, CoMSaT: 'A novel single-chip fabrication technique for three-dimensional MEMS, Sensors and Actuators' A. 72, No. 2, pp. 115–124, 1999.
3. Quanbo Zou et al, 'Single-chip fabrication of integrated fluid system (IFS)', Proc. 11h IEEE MEMS98 Workshop, Heidelberg (Germany), pp. 448–453, January 1998.
4. J. Chen et al, 'A high-resolution silicon monolithic nozzle array for ink jet printing', The 8th International Conference on Solid-State Sensors and Actuators (Transducers '95, and Eurosensors IX), Stockholm, Sweden, pp. 321–324, June 1995.

A routine search of the patented prior art was also performed with the following references of interest being found:

In U.S. Pat. No. 6,093,330 B1, Chong, et al. disclose a microfabrication process for enclosed microstructures using an anisotropic etch and an isotropic etch. Liu, et al., in U.S. Pat. No. 6,225,140, show a CMOS compatible surface machined pressure sensor. The pressure sensor is formed by etching a number of trenches in a substrate. Dielectric spacers are formed on the sidewalls of the trenches. The bottoms of the trenches are then etched using isotropic etching to undercut the trench sidewalls. U.S. Pat. No. 6,075,269 (Terasawa, et al.) discloses a device that includes a recessed portion formed by isotropic-etching, then anisotropic etching and isotropic etching while Shaw et al. in U.S. Pat. No. 5,719,073 show microstructures and use a single mask, single-crystal process for fabrication thereof.

SUMMARY OF THE INVENTION

It has been an object of at least one embodiment of the present invention to provide a process for manufacturing a complete micro-fluidic system contained on a single chip.

Another object of at least one embodiment of the present invention has been that said process utilize only dry etching.

Still another object of at least one embodiment of the present invention has been that said process include sub-processes to manufacture micro-chambers having a high degree of thermal isolation as well as low thermal mass.

A further object of at least one embodiment of the present invention has been that said process include sub-processes to manufacture micro-pumps.

These objects have been achieved by an improvement over the state of the art fabrication processes for integrated micro-fluidic systems, including liquid handling, reaction and on-chip sensing/detection which are normally multi-wafer fabrication procedures. These complicated prior art processes increase the fabrication cost and degrade the performance of the system. A few single silicon wafer approaches in the literatures have stated difficulty in the micro-fluidic control and on-chip sensing/detection. The thermal reactors disclosed so far have used multi-wafer process, which has limited the integration and the disposability of the devices. The present invention uses only dry etch processes to form micro-chambers. In particular, it makes use of deep reactive ion etching whereby multiple trenches of differing depths may be formed simultaneously. Buried micro-chambers are formed by isotropically increasing trench widths using an etchant that does not attack the mask so the trenches grow wider beneath the surface until they merge. Deposition of a dielectric layer over the trenches allows some trenches to be sealed and some to be left open. Micro-pumps are formed by including a layer in the micro-chamber roof. This layer is used to change chamber volume either through electrostatically induced motion or through thermal mismatch as a result of its being heated.

DESCRIPTION OF THE PREFERRED EMBODIMENTS

Figure 1:
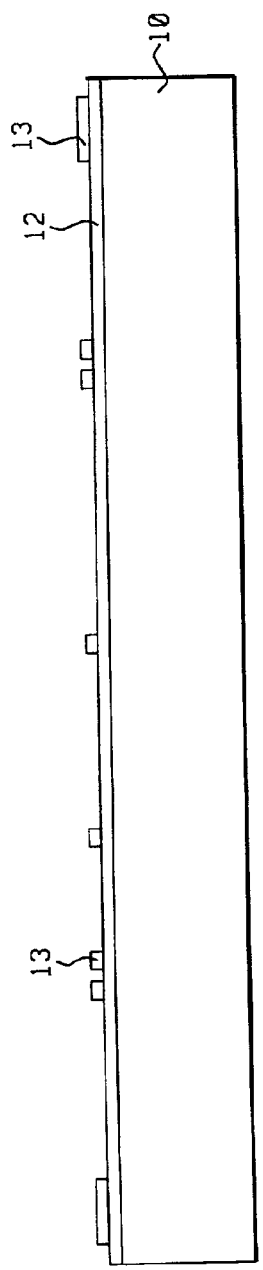
FIG. 1 illustrates the starting point for the process of the present invention.

We begin a detailed description of the general process of the present invention by referring to FIG. 1 and noting that a key feature of the present invention is that all etching steps relating to the formation of cavities and trenches are limited to dry etch processes. Seen in FIG. 1 is silicon body 10 which would normally be part of a silicon wafer in which all necessary integrated circuits for operation of the full fluidic system have already been formed. Dielectric layer 12 is then deposited onto the topmost surface of wafer 10. This layer could be silicon oxide, silicon nitride, or any polymeric materials such as polyimides, parylenes, epoxies, etc., with silicon oxide being preferred. It is deposited to a thickness between about 0.3 and 2 microns.

Then conductive layer 13 is deposited onto layer 12. As will become clearer below, this layer can be patterned to perform different functions, depending on what lies immediately below it. Most commonly, parts of layer 13 will be used to provide top level wiring for the afore-mentioned integrated circuits. One item that is common to all embodiments are pads that will be used to make contact between the system and the external world.

Figure 2:
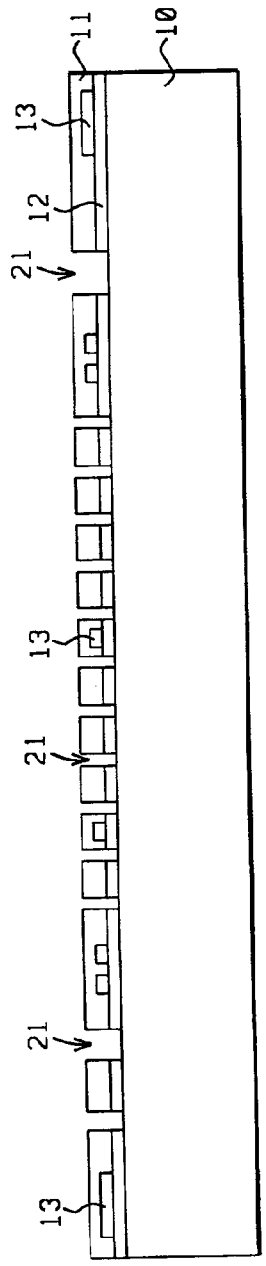
FIG. 2 shows formation of a hard mask to be used during trench etching.

After layer 13 has been suitably patterned, dielectric layer 11 (any one of silicon oxide, silicon nitride, or any polymeric materials such as polyimides, parylenes, epoxies, etc., with silicon oxide being preferred) is deposited to a thickness between about 1 and 4 microns and is then patterned to form a plurality of openings such as 21 in FIG. 2. These extend downward as far as silicon body 10. It is a key feature of the invention that at least two different widths are involved for these openings since, in the next step, layer 11 is used as a hard mask for etching trenches down into the silicon and the etch process is such that etch rate is influenced in part by trench width, with wider trenches forming faster than narrower trenches. Typically, an increase in trench width by a factor of between 2 and 250 results in an increase in etch rate, during deep reactive ion etching, by a factor of between 1 and 5.

Figure 3:
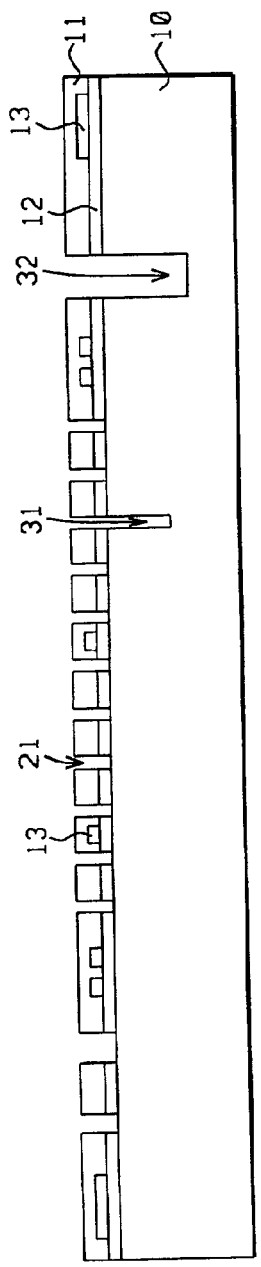
FIG. 3 illustrates how multiple trenches having different depths may be simultaneously formed.

This dependence of etch depth on trench width is a property of the etch method that is used at this stage of the process, namely deep reactive ion etching (DRIE). To implement DRIE we have used $SF_6$, $O_2$, and $C_4F_8$ gases. An example of this is illustrated in FIG. 3 where, after etching under the same conditions for the same time, trench 31 is not as deep as wider trench 32. This allows multiple trenches having different depths to be formed simultaneously simply through control of trench width. Note that, for purposes of clarification, the other trenches that formed at the same time as 31 and 32 are not shown in FIG. 3.

Note that it is also necessary to provide trenches having a range of widths since, when two trenches of different widths are connected, a flow valve is formed at their intersection This is a result of capillary effects—for a hydrophillic liquid, flow out of narrow tube into a wider one tends to be resisted while flow from a wide tube into a narrower one tends to be enhanced. The reverse holds true for a hydrophobic liquid.

Another key step now follows, namely the performance of isotropic dry etching of silicon body 10. This was implemented using $XeF_2$ or $SF_6$ in DRIE, or $SF_6$ in plasma or wet etching processes, with $SF_6$ in DRIE being preferred. The etchant selectively attacks only the silicon so that all trenches grow wider (as well as deeper) without the openings 21 changing their dimensions so that a substantial amount of undercutting of layer 11 takes place. Where two trenches are sufficiently close to one another they will eventually merge into a single cavity. In the example shown in FIG. 4, a large number of trenches were located close enough to one another to form the single cavity 45.

Figure 4:
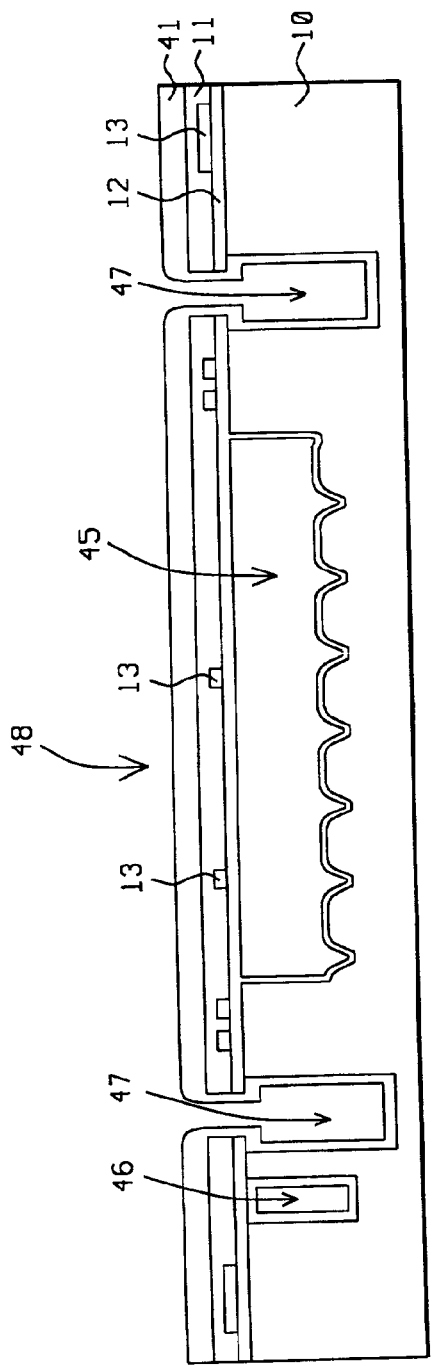
FIG. 4 illustrates the formation of a fully covered micro-chamber.

After the conclusion of isotropic etching, a third dielectric layer (layer 41) is deposited, as seen in FIG. 4. This layer could be silicon oxide, silicon nitride, or any polymeric materials such as polyimides, parylenes, epoxies, etc., with silicon oxide being preferred. Its thickness (between about 1 and 5 microns) is made to be sufficient to seal some of the trenches (those whose openings have widths less than twice this thickness). In particular, all the trenches out which cavity 45 was formed are sealed in this manner thus fully enclosing 45. In FIG. 4 we also show examples of a sealed trench 46 that is outside cavity 45 as well as two wider trenches 47 that were not sealed.

Figure 6:
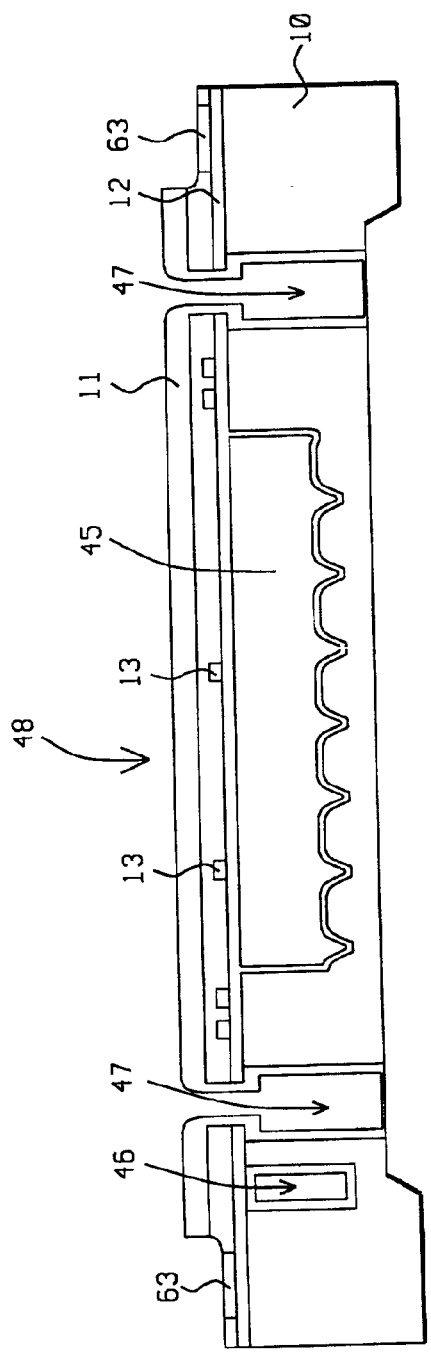
FIG. 6 shows the end-product of the process of the present invention.

The final step (in the general process) is the selective removal of layers 11 and 41 to expose the contact pads that were mentioned above. These can be seen as pads 63 in FIG. 6.

Figure 7:
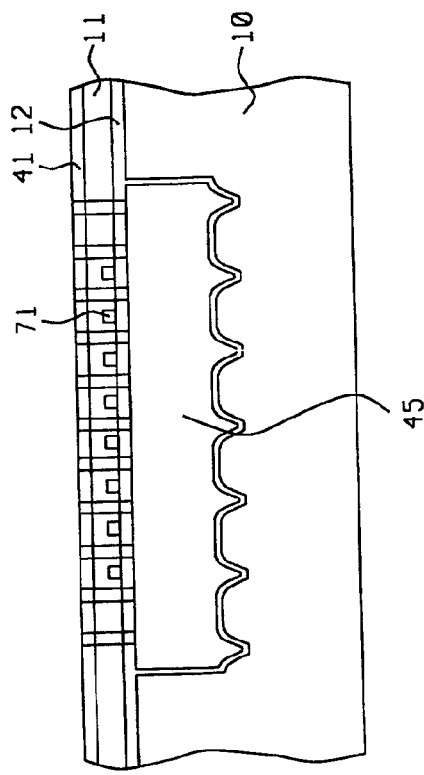
FIG. 7 is a close-up view of a micro-chamber, including a heating element.

Depending on application, there are several sub-processes that form part of the present invention:

Sub-Process 1a, Formation of Electrostatically Driven Micro Pumps:

Referring once again to FIG. 4, in the area immediately above cavity 45 (whose center is pointed to by arrow 48), conductive layer 13 is patterned to form electrode 71 (see FIG. 7 for closeup view) which covers all available area except at the opening that were used to form the trenches. Layer 13 is any conductive material such as Al, Ti, Au, including their alloys, and polysilicon, with Al being preferred. It is deposited to a thickness between about 1 and 3 microns, with 2.5 microns being preferred, and is electrically insulated from the silicon wafer 10 so that a voltage may be applied between it and 10. When this is done, it, and the membrane (layers 11, 12, and 41) of which it is a part, are attracted or repelled (depending on their relative polarities) because of electrostatic forces, thereby causing the membrane to bow inwards or outwards. This changes the volume of the cavity so that liquid will be pumped out of or into the cavity. The trenches etched as part of forming the pump chamber have widths between about 1 and 5 microns and depths between about 50 and 250 microns. As discussed for the general process, fluid flow is controlled through flow valves formed at the intersections of trenches having different widths. Thus, by connecting to the chamber through two separate trenches, each having a different width from the other, fluid will be prefer to come in through one of these trenches and out through the other.

Sub-Process 1b, Formation of Thermal Mismatch Driven Micro Pumps:

Continuing our reference to FIG. 4, in the area immediately above cavity 45 (whose center is pointed to by arrow 48), conductive layer 13 is patterned to form a resistive element 71 (see FIG. 7 for closeup view) that is electrically insulated from the silicon wafer 10. The exact form of this resistive element is not important as long as it covers most of the area over cavity 45. When current is passed through the resistive element it heats that part of the membrane with which it is in contact, causing the latter to expand and thus bow. The direction of this bowing will depend on the relative expansions of the layers making up the membrane in a manner analogous to the bowing of a bimetallic strip when it is heated. Regardless of the direction of bowing, it changes the volume of the cavity so that liquid will be pumped in or out of it. When current ceases to flow through the resistive element the membrane cools and the original cavity volume is restored.

To form a micro-pump of this type, layer 12 was one of silicon oxide, silicon nitride, or any polymeric materials such as polyimides, parylenes, epoxies, etc., with silicon oxide being preferred. It was deposited to a thickness between about 0.3 and 2 microns, with 0.5 microns being preferred and it had an appropriate coefficient of thermal expansion. Layer 11 was also one of silicon oxide, silicon nitride, or any polymeric materials such as polyimides, parylenes, epoxies, etc., with silicon oxide being preferred. It was deposited to a thickness between about 1 and 4 microns, with 3 microns being preferred. Layer 41 was one of silicon oxide, silicon nitride, or any polymeric materials such as polyimides, parylenes, epoxies, etc., with silicon oxide being preferred. It was deposited to a thickness between about 1 and 5 microns, with 4 microns being preferred.

Since material used to form the resistive element was also used to provide conductive wiring in other parts of the system, material normally used to form thin film resistors could not be used. However, it will be understood that such materials could have been utilized by adding one additional step to the process. The material that we chose for layer 13 (to be formed into element 71) was any of Al, Ti, Au, including their alloys, and polysilicon, with Al being preferred. It was deposited to a thickness between about 1 and 3 microns.

Sub-Process 2, Formation of Thermally Isolated Cavities

Figure 5:
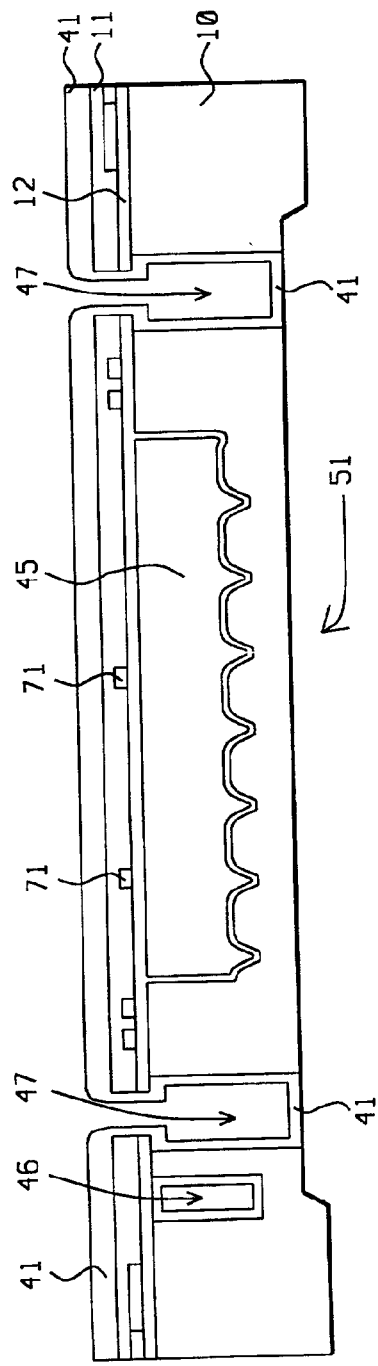
FIG. 5 shows how thermal isolation of said micro-chamber is achieved.

The formation of cavities such as 45 in FIG. 5 was discussed in the description of the general process above. More specifically, to form micro-chambers suitable for thermal processing, the trenches from which the cavity was formed (by merging them) each had a width between about 8 and 12 microns and were separated by between about 40 and 60 microns, their depth being between about 140 and 220 microns.

Thermal processing in micro-fluidic systems requires that the micro-chambers in which such processing occurs be well thermally insulated and have low thermal capacitance. FIG. 5 illustrates how these conditions can readily be met through a small additional step to the general process discussed above. This is to selectively etch wafer 10 from its underside over an area that includes micro-chamber 45 as well as trenches 47 that are adjacent to it. Etching of the silicon wafer from its underside was accomplished by KOH followed by RIE using $SF_6$.

In practice, trenches 47 would be in the form of a frame that almost completely surrounds micro-chamber 45. Typically, trenches 47 would be located within a distance of between about 300 and 500 microns from micro-chamber 45. The width of trenches 47 was typically between about 8 and 12 microns while their depth exceeded that of micro-chamber 45 by between about 140 and 220 microns. Etching from the underside was allowed to continue to a depth that is sufficient to expose dielectric layer 41 or to fully etch through trenches 47. As noted earlier, the reservoir is not sealed so that when 45 is heated pressure does not build up inside 47.

Results

Figure 8:
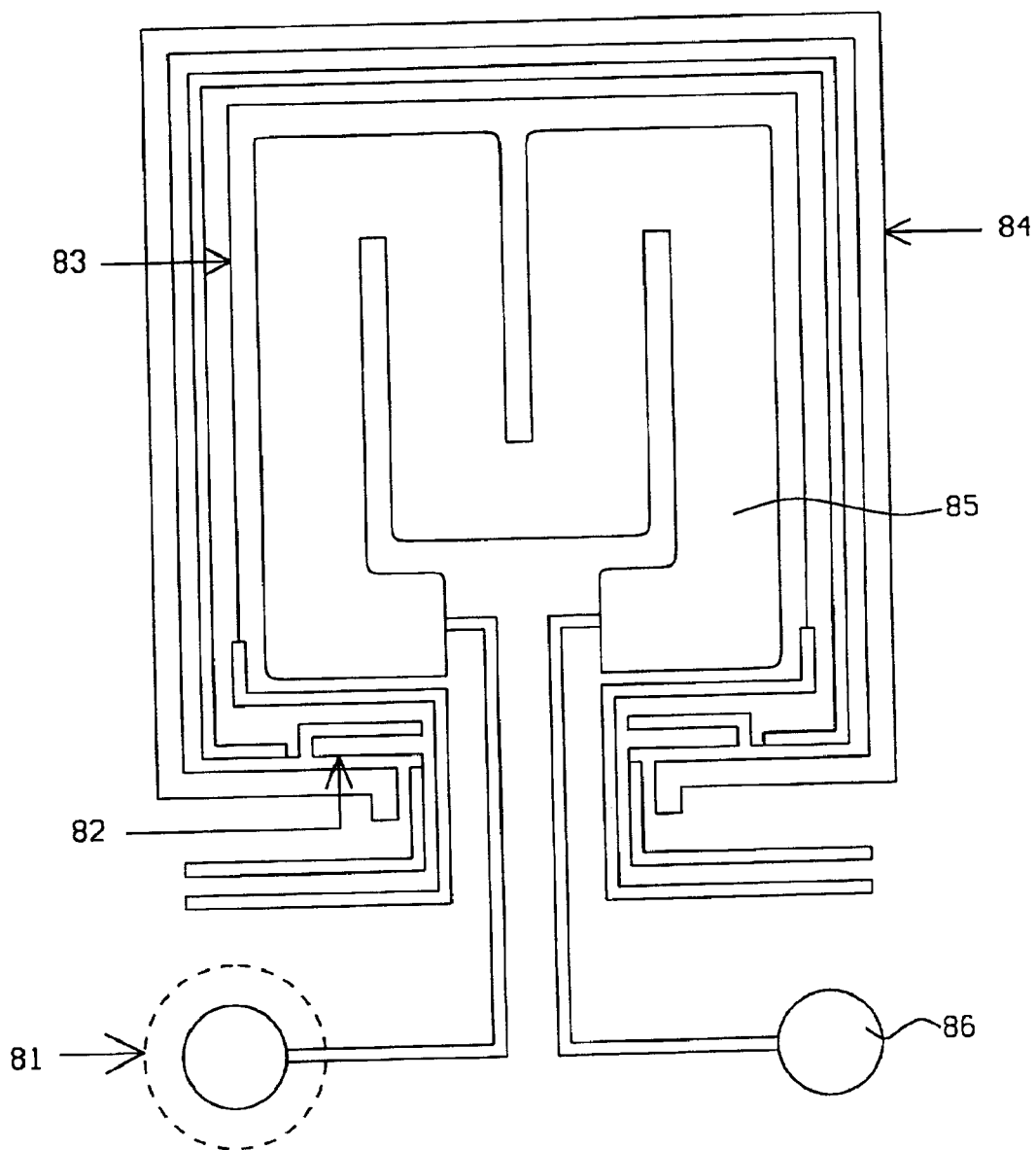
FIG. 8 is a plan view of the present invention.

Prototype chips have been successfully fabricated. A plan view of part of one such chip is schematically illustrated in FIG. 8. Seen in the figure are inlet pump 81, heater 82, temperature sensor 83, isolation trench 84, PCR chamber 85, and reservoir 86. The chip is directly mounted onto a metal nesting fixture as a heat sink, and electronically led out through side connectors (without the need for wire-bonding). This configuration further reduces the fabrication cost of the chip. Structures for the micro-fluidics (micro reaction chamber, micro-channel, valve, pump, etc.), heater/sensor and the detection electrode have been tested.

Reaction chambers with up to 1 mm width can be filled up with liquid (water-like) easily without introducing air bubbles. The very low thermal mass has speeded up thermal cycling to 1.5 min. for 30 cycles (each cycle has 3 set points: 95° C., 55° C. and 72° C., as usually used in PCR procedures) with PID (proportional-integral-derivative) control. With the targeting chamber-depth of 130 µm, silicon beam/membrane thickness of 200 µm, 3 µL reaction volume, the required power consumption is only 0.25 Watt on average for each reaction chamber. The average ramping and cooling rates are greater than 50° C./sec and 40° C./sec, respectively, which is fast enough for most of the thermal reactions. The total power consumption for one chip (containing 4 reactors) is only around 1 Watt. Temperature uniformity of better than ±0.3° C. was achieved in simulation. The top sealing dielectric layers are transparent for most visible light (including normal fluorescence at wavelengths of 510 nm and above).

What is claimed is:

1. A process to manufacture an integrated micro-fluidic system, comprising:

limiting all etching steps, with the exception of silicon backside etching, to dry etch processes;

providing a silicon body having a topmost surface beneath which are one or more integrated circuits;

on said topmost surface, depositing a first dielectric layer;

on said first dielectric layer, depositing a conductive layer and forming therefrom a pattern that includes at least one contact pad connected to said integrated circuits;

on said conductive and first dielectric layer, depositing a second dielectric layer;

patterning said second dielectric layer to form therein a plurality of openings such that at least two of said openings have different widths from each other, said openings extending downward as far as said topmost surface;

then, using said second dielectric layer as a hard mask, performing deep reactive ion etching whereby trenches are etched into said silicon body at said openings, said trenches etching at rates that are proportional to their widths, with trenches having wider openings being etched at faster rates;

with said second dielectric layer remaining in place, performing isotropic etching of said silicon body whereby said trenches grow wider while said openings remain unchanged;

continuing said isotropic etching until at least two trenches merge to form a single cavity;

then depositing a third dielectric layer to a thickness sufficient to seal all trenches whose openings have a width that is less than two times said thickness; and selectively removing said second and third dielectric layers so as to expose said contact pad.

2. The process described in claim 1 wherein two trenches of different widths are connected, thereby forming at their intersection a flow valve.

3. The process described in claim 1 wherein said first dielectric layer is selected from the group consisting of silicon oxide, silicon nitride, and polymeric materials.

4. The process described in claim 1 wherein said first dielectric layer is deposited to a thickness between about 0.3 and 2 microns.

5. The process described in claim 1 wherein said second dielectric layer is selected from the group consisting of silicon oxide, silicon nitride, and polymeric materials.

6. The process described in claim 1 wherein said second dielectric layer is deposited to a thickness between about 1 and 4 microns.

7. The process described in claim 1 wherein said third dielectric layer is selected from the group consisting of silicon oxide, silicon nitride, and polymeric materials.

8. The process described in claim 1 wherein said third dielectric layer is deposited to a thickness between about 1 and 5 microns.

9. The process described in claim 1 wherein the step of deep reactive ion etching is implemented using gases selected from the group consisting of $SF_6$, $O_2$, and $C_4F_8$.

10. The process described in claim 1 wherein the step of isotropic dry etching is selected from the group of processes consisting of $XeF_2$ in DRIE, $SF_6$ in DRIE, $SF_6$ in plasma etching, and wet etching.

11. The process described in claim 1 wherein an increase in trench width by a factor of between 1 and 250 results in an increase in etch rate, during deep reactive ion etching, by a factor of between 1.1 and 5.

12. A process to manufacture an integrated micro-fluidic system, including a micro-pump, comprising:

limiting all etching steps, with the exception of silicon backside etching, to dry etch processes;

providing a silicon body having a topmost surface beneath which are one or more integrated circuits;

on said topmost surface, depositing a first dielectric layer;

on said first dielectric layer, depositing a conductive layer and forming therefrom an electrode, that is electrically insulated from said silicon body, as well as at least one contact pad connected to said integrated circuits;

on said conductive and first dielectric layer, depositing a second dielectric layer;

patterning said second dielectric layer to form therein a plurality of openings such that at least two of said openings have different widths from each other, said openings extending downward as far as said topmost surface;

then, using said second dielectric layer as a hard mask, performing deep reactive ion etching whereby trenches are etched into said silicon body at said openings, said trenches having depths that are proportional to their widths, with wider openings leading to deeper trenches;

with said second dielectric layer remaining in place, performing isotropic etching of said silicon body whereby said trenches grow wider while said openings remain unchanged;

continuing said isotropic etching until at least two trenches merge to form a cavity, having a volume, below said electrode;

then depositing a third dielectric layer to a thickness sufficient to seal all trenches whose openings have a width that is less than two times said thickness, whereby said cavity becomes covered by a membrane comprising said electrode, said first dielectric layer, said second dielectric layer, and said third dielectric layer;

providing electrical connections to said electrode and said silicon body whereby, through application of voltage, electrostatic interaction between said electrode and said silicon body will occur causing said membrane to bow, thereby changing the volume of said cavity and causing a pumping action on any fluid within said cavity; and selectively removing said second and third dielectric layers so as to expose said contact pad.

13. The process described in claim 12 wherein said conductive layer is selected from the group consisting of Al, Ti, Au, including their alloys, and polysilicon.

14. The process described in claim 12 wherein said conductive layer is deposited to a thickness between about 1 and 3 microns.

15. The process described in claim 12 wherein said trenches have widths between about 1 and 5 microns.

16. The process described in claim 12 wherein said trenches have depths between about 50 and 250 microns.

17. A process to manufacture an integrated micro-fluidic system, including a micro-pump, comprising:

limiting all etching steps to dry etch processes and depositing at least two layers that have different coefficients of thermal expansion;

providing a silicon body having a topmost surface beneath which are one or more integrated circuits;

on said topmost surface, depositing a first dielectric layer;

on said first dielectric layer, depositing a conductive layer and forming therefrom a resistive element, that is electrically insulated from said silicon body, as well as at least one contact pad connected to said integrated circuits;

on said conductive and first dielectric layer, depositing a second dielectric layer;

patterning said second dielectric layer to form therein a plurality of openings such that at least two of said openings have different widths from each other, said openings extending downward as far as said topmost surface;

then, using said second dielectric layer as a hard mask, performing deep reactive ion etching whereby trenches are etched into said silicon body at said openings, said trenches having depths that are proportional to their widths, with wider openings leading to deeper trenches;

with said second dielectric layer remaining in place, performing isotropic etching of said silicon body whereby said trenches grow wider while said openings remain unchanged;

continuing said isotropic etching until at least two trenches merge to form a cavity, having a volume;

then depositing a third dielectric layer to a thickness sufficient to seal all trenches whose openings have a width that is less than two times said thickness, whereby said cavity becomes covered by a membrane comprising said resistive element, said first dielectric layer and said second dielectric layer and said third dielectric layer;

providing electrical connections to said resistive element whereby, through application of voltage, said membrane is heated by said resistive element and bows, thereby changing the volume of said cavity and causing a pumping action; and selectively removing said second and third dielectric layers so as to expose said contact pad.

18. The process described in claim 17 wherein said first dielectric layer is selected from the group consisting of silicon oxide, silicon nitride, and polymeric materials and is deposited to a thickness between about 0.3 and 2 microns.

19. The process described in claim 17 wherein said second dielectric layer is selected from the group consisting of silicon oxide, silicon nitride, and polymeric materials and is deposited to a thickness between about 1 and 4 microns.

20. The process described in claim 17 wherein said third dielectric layer is selected from the group consisting of silicon oxide, silicon nitride, and polymeric materials and is deposited to a thickness between about 1 and 5 microns.

21. The process described in claim 17 wherein said conductive layer is selected from the group consisting of Al, Ti, Au, including their alloys, and polysilicon.

22. The process described in claim 17 wherein said conductive layer is deposited to a thickness between about 1 and 3 microns.

23. The process described in claim 17 wherein said trenches have widths between about 1 and 5 microns.

24. The process described in claim 17 wherein said trenches have depths between about 50 and 250 microns.

25. A process to manufacture an integrated micro-fluidic system, including a thermally isolated micro-chamber, comprising:

provide a silicon wafer having a topmost surface beneath which are one or more integrated circuits;

on said topmost surface, depositing a first dielectric layer;

on said first dielectric layer, depositing a conductive layer and forming therefrom a resistive element, that is electrically insulated from said silicon wafer, as well as at least one contact pad connected to said integrated circuits;

on said conductive layer and said first dielectric layer, depositing a second dielectric layer;

patterning said second dielectric layer to form therein a plurality of openings such that at least two of said openings have different widths from each other, said openings extending downward as far as said topmost surface;

then, using said second dielectric layer as a hard mask, performing deep reactive ion etching whereby trenches are etched into said silicon wafer at said openings, said trenches having depths that are proportional to their widths, with wider openings leading to deeper trenches;

with said second dielectric layer remaining in place, performing isotropic etching of said silicon wafer whereby said trenches grow wider while said openings remain unchanged;

continuing said isotropic etching until at least two trenches merge to form a cavity, having a volume;

then depositing a third dielectric layer to a thickness sufficient to seal all trenches whose openings have a width that is less than two times said thickness, whereby said cavity becomes said thermally isolated micro-chamber covered by a membrane comprising said resistive element, said first dielectric layer, said second dielectric layer and said third dielectric layer, there being on opposing sides, and adjacent to, said thermally isolated micro-chamber unsealed trenches, having floors, whose depth exceeds that of said cavity;

selectively etching said silicon wafer from its underside over an area that includes said thermally isolated micro-chamber and said trenches adjacent thereto, to a depth sufficient to expose said third dielectric layer on the floors of said adjacent trenches, thereby thermally isolating said thermally isolated micro-chamber;

providing electrical connections to said resistive element whereby, through application of voltage, said thermally isolated micro-chamber and its contents are heated by said resistive element; and selectively removing said second and third dielectric layers so as to expose said contact pad.

26. The process described in claim 25 wherein said trenches that merge to form said cavity each have a width between about 8 and 12 microns and are separated by between about 40 and 80 microns.

27. The process described in claim 25 wherein said trenches that merge to form said cavity each have a depth between about 140 and 220 microns.

28. The process described in claim 25 wherein the step of selectively etching said silicon wafer from its underside further comprises wet etching with KOH followed by reactive ion etching (RIE) using $SF_6$.

29. The process described in claim 25 wherein said trenches adjacent to said thermally isolated micro-chamber are located within a distance of between about 300 and 500 microns from said cavity.

30. The process described in claim 25 wherein said trenches adjacent to said thermally micro-chamber have a width of between about 1 and 5 microns.

31. The process described in claim 25 wherein said trenches adjacent to said thermally isolated micro-chamber have a depth that exceeds that of said micro-chamber by between about 50 and 250 microns.

* * * * *